(12) United States Patent
Cobb et al.

(10) Patent No.: US 12,283,561 B2
(45) Date of Patent: Apr. 22, 2025

(54) FLEXIBLE ELECTRONIC STRUCTURE

(71) Applicant: PRAGMATIC SEMICONDUCTOR LIMITED, Cambridge (GB)

(72) Inventors: Brian Cobb, Sedgefield Durham (GB); Richard Price, Sedgefield Durham (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 504 days.

(21) Appl. No.: 17/611,604

(22) PCT Filed: May 19, 2020

(86) PCT No.: PCT/GB2020/051219
§ 371 (c)(1),
(2) Date: Nov. 16, 2021

(87) PCT Pub. No.: WO2020/234581
PCT Pub. Date: Nov. 26, 2020

(65) Prior Publication Data
US 2022/0246500 A1    Aug. 4, 2022

(30) Foreign Application Priority Data
May 21, 2019 (GB) ..................... 1907158

(51) Int. Cl.
*H01L 23/00* (2006.01)
*H01L 23/367* (2006.01)
(Continued)

(52) U.S. Cl.
CPC ............ *H01L 24/19* (2013.01); *H01L 23/367* (2013.01); *H01L 23/4985* (2013.01);
(Continued)

(58) Field of Classification Search
CPC ....... H01L 23/645; H01L 24/83; H01L 24/16; H01L 24/05; H01L 23/5225;
(Continued)

(56) References Cited

U.S. PATENT DOCUMENTS 5,120,665 A    6/1992  Tsukagoshi et al.
5,804,882 A    9/1998  Tsukagoshi et al.
(Continued)

FOREIGN PATENT DOCUMENTS

DE    3924439 A     4/1991
EP    1093160 A2    4/2001
(Continued)

OTHER PUBLICATIONS

U.S. Appl. No. 17/611,611, filed Nov. 16, 2021, Cobb et al.
(Continued)

*Primary Examiner* — Mouloucoulaye Inoussa
(74) *Attorney, Agent, or Firm* — Jason H. Vick; Amped IP LLC

(57) ABSTRACT

There is provided a flexible electronic structure for bonding with an external circuit, comprising a flexible substrate, having a first surface, configured for bonding with the external circuit, and an opposing second surface, configured for engagement with a bonding tool, comprising at least one electronic component; at least one contact member, operatively coupled with said at least one electronic component and provided at said first surface of said flexible substrate, and adapted to operably interface with the external circuit after bonding, and at least one shield member, provided at said first surface so as to shieldingly overlap at least a portion of said at least one electronic component, adapted to withstand a predetermined pressure applied to said first surface and/or said opposing second surface during bonding with the external circuit.

19 Claims, 2 Drawing Sheets

(51) Int. Cl.
*H01L 23/498* (2006.01)
*H01L 23/522* (2006.01)
*H05K 1/18* (2006.01)

(52) U.S. Cl.
CPC ........ *H01L 23/5225* (2013.01); *H01L 23/562* (2013.01); *H01L 24/05* (2013.01); *H01L 24/16* (2013.01); *H01L 24/20* (2013.01); *H01L 24/32* (2013.01); *H01L 24/83* (2013.01); *H05K 1/181* (2013.01); *H01L 24/81* (2013.01); *H01L 24/82* (2013.01); *H01L 2224/03318* (2013.01); *H01L 2224/04105* (2013.01); *H01L 2224/16265* (2013.01); *H01L 2224/16268* (2013.01); *H01L 2224/2919* (2013.01); *H01L 2224/32268* (2013.01); *H01L 2224/81203* (2013.01); *H01L 2224/81898* (2013.01); *H01L 2224/83203* (2013.01); *H01L 2224/83851* (2013.01); *H01L 2924/30105* (2013.01); *H01L 2924/3025* (2013.01); *H01L 2924/3511* (2013.01); *H01L 2924/3512* (2013.01)

(58) Field of Classification Search
CPC ..... H01L 23/552; H01L 24/02; H01L 23/562; H01L 23/4985; H01L 24/20; H01L 24/32; H01L 23/367; H01L 24/19; H01L 24/82; H01L 24/13; H01L 24/81; H01L 25/18; H01L 21/6835; H01L 25/16; H01L 23/5389; H01L 21/561; H01L 25/50; H01L 25/0655; H01L 21/56; H01L 23/5383; H01L 21/6836; H01L 23/3185; H01L 21/4857; H01L 23/49816; H01L 23/49822; H01L 23/3128; H01L 23/66; H01L 23/5384; H01L 24/94; H01L 23/5386; H01L 25/0657; H01L 23/31; H01L 25/105; H01L 24/73; H01L 23/49827; H01L 24/92; H01L 21/4853; H01L 23/3135; H01L 24/08; H01L 23/48; H01L 23/49838; H01L 23/3736; H01L 23/5286; H01L 2224/83851; H01L 2224/05548; H01L 2224/83203; H01L 2924/19042; H01L 2924/30105; H01L 2224/32225; H01L 2223/6677; H01L 2224/02317; H01L 2224/2919; H01L 2224/81192; H01L 2224/03318; H01L 2224/32145; H01L 2224/32268; H01L 2224/02311; H01L 2224/16145; H01L 2224/81193; H01L 2224/83101; H01L 2224/81898; H01L 2224/16238; H01L 2221/68372; H01L 2221/68345; H01L 2224/24137; H01L 2224/32227; H01L 2224/18; H01L 2224/1145; H01L 2224/13655; H01L 2924/15321; H01L 2224/13639; H01L 2224/81399; H01L 2224/83005; H01L 2224/81001; H01L 2224/13101; H01L 2224/16225; H01L 2224/92125; H01L 2221/68381; H01L 2924/14; H01L 2224/73204; H01L 2924/00012; H01L 2224/16227; H01L 2924/3025; H01L 2221/68359; H01L 2224/12105; H01L 2224/73267; H01L 2924/15331; H01L 2924/15311; H01L 2924/18161; H01L 2225/1035; H01L 2225/1041; H01L 2225/1058; H01L 2225/107; H05K 1/181; H01Q 9/0414; H01Q 9/0407; H01Q 1/2283; H01Q 21/205; H01Q 21/065

USPC .......... 257/737, 773, 690, 659, 686, 21.499, 257/23.06, 21.502, 23.114, 23.085; 438/107, 124, 127, 109
See application file for complete search history.

(56) References Cited

U.S. PATENT DOCUMENTS

| | | |
|---|---|---|
| 5,953,589 A | 9/1999 | Shim et al. |
| 6,069,026 A | 5/2000 | Terrill et al. |
| 6,346,750 B1 | 2/2002 | Jiang et al. |
| 8,083,150 B2 | 12/2011 | Sakurai et al. |
| 8,766,284 B1 | 7/2014 | Dutta |
| 10,134,685 B1* | 11/2018 | Chen .................. H01L 23/5389 |
| 2002/0105078 A1 | 8/2002 | Lee et al. |
| 2002/0196614 A1 | 12/2002 | DiBene, II et al. |
| 2003/0057550 A1 | 3/2003 | Zhao et al. |
| 2008/0067656 A1* | 3/2008 | Leung .................. H01L 23/5385 |
| | | 438/109 |
| 2008/0150093 A1* | 6/2008 | Jang ..................... H01L 25/0657 |
| | | 257/659 |
| 2010/0214759 A1* | 8/2010 | Beddingfield ...... H01L 25/0657 |
| | | 361/818 |
| 2010/0244222 A1* | 9/2010 | Chi .................... H01L 23/49575 |
| | | 257/E23.06 |
| 2010/0290191 A1 | 11/2010 | Lin et al. |
| 2011/0090658 A1 | 4/2011 | Adams et al. |
| 2011/0140258 A1* | 6/2011 | Do ........................ H01L 25/105 |
| | | 257/E21.511 |
| 2011/0147901 A1* | 6/2011 | Huang .................. H01L 23/552 |
| | | 257/E21.705 |
| 2011/0227209 A1* | 9/2011 | Yoon .................... H01L 23/3128 |
| | | 438/109 |
| 2012/0139091 A1* | 6/2012 | Wakabayashi .......... H01L 23/66 |
| | | 257/659 |
| 2014/0003011 A1 | 1/2014 | Kato et al. |
| 2014/0021264 A1 | 1/2014 | Pueschner et al. |
| 2014/0361427 A1 | 12/2014 | Kim |
| 2014/0361428 A1* | 12/2014 | Park ..................... H01L 23/552 |
| | | 257/737 |
| 2015/0014862 A1* | 1/2015 | Kwon .................. H01L 23/3128 |
| | | 257/775 |
| 2015/0077949 A1 | 3/2015 | Baek et al. |
| 2015/0091149 A1* | 4/2015 | Jang ..................... H01L 23/3128 |
| | | 257/686 |
| 2015/0278675 A1 | 10/2015 | Finn et al. |
| 2016/0056127 A1* | 2/2016 | Lee ......................... H01L 24/49 |
| | | 257/659 |
| 2016/0254761 A1 | 9/2016 | Furukawa et al. |
| 2017/0025593 A1 | 1/2017 | Bower et al. |
| 2017/0194263 A1 | 7/2017 | Kato |
| 2017/0278830 A1* | 9/2017 | Kim ....................... H01L 25/105 |
| 2018/0006008 A1* | 1/2018 | Lin .......................... H01L 24/20 |
| 2018/0053732 A1* | 2/2018 | Baek .................... H01L 23/5389 |
| 2018/0166405 A1* | 6/2018 | Chiang .................... H01L 24/20 |
| 2018/0233457 A1* | 8/2018 | Chen ....................... H01L 21/56 |
| 2018/0247905 A1* | 8/2018 | Yu ........................ H01L 21/6835 |
| 2018/0261557 A1* | 9/2018 | Yu .......................... H01L 23/562 |
| 2019/0006289 A1* | 1/2019 | Huang .................... H01L 24/02 |
| 2019/0123004 A1* | 4/2019 | Chang ................... H01L 21/568 |
| 2020/0006310 A1* | 1/2020 | Hu ........................ H01L 21/565 |
| 2020/0013735 A1* | 1/2020 | Liu ....................... H01L 23/481 |
| 2020/0035625 A1* | 1/2020 | Wang ................... H01L 23/552 |
| 2020/0051882 A1* | 2/2020 | Watanabe ............. H01L 21/568 |
| 2020/0176376 A1* | 6/2020 | Ndip ...................... H01L 24/48 |
| 2020/0294980 A1* | 9/2020 | Otsubo .................... H05K 3/46 |
| 2020/0312821 A1* | 10/2020 | Yan ..................... H01L 25/0753 |
| 2020/0321288 A1* | 10/2020 | Huang .................. H01L 23/552 |
| 2021/0013585 A1* | 1/2021 | Ho ....................... H01L 23/552 |
| 2021/0020559 A1* | 1/2021 | Hung ...................... H01Q 1/526 |
| 2021/0098391 A1* | 4/2021 | Wu ...................... H01L 23/552 |
| 2021/0242117 A1* | 8/2021 | Hung .................. H01L 21/6835 |
| 2022/0181267 A1* | 6/2022 | Kung ................... H01L 23/552 |
| 2022/0238472 A1* | 7/2022 | Cobb ..................... H01L 24/02 |
| 2022/0320020 A1* | 10/2022 | Hsu ........................ H01L 23/66 |

(56) References Cited

U.S. PATENT DOCUMENTS

FOREIGN PATENT DOCUMENTS

| GB | 2581149 A | 8/2020 |
|---|---|---|
| KR | 10-2015-0001125 A | 1/2015 |
| WO | WO 2007/061216 A1 | 5/2007 |

OTHER PUBLICATIONS

U.S. Appl. No. 17/611,614, filed Nov. 16, 2021, Williamson et al.
Hassan, Mahadi-Ul et al. "Assembly and Embedding of Ultra-Thin Chips in Polymers" XP032547032; EMPC 2013, Grenoble, France; Sep. 9, 2013.
Hollman, Richard et al. "Ultra Fine RDL Structure Fabrication Using Alternative Patterning and Botom-Up Plating Processes" XP033383278; 2018 IEEE 68th Electronic Components and Technology Conference; May 19, 2018.
Mashayekhi, Mohammad et al. "Chip-by-Chip Configurable Interconnection Using Digital Printing Techniques" XP020314891; Journal of Micromechanics and Microengineering; vol. 27, No. 4; Mar. 6, 2017.
Invitation to Pay Additional Fees and, Where Applicable, Protest Fee for International Application No. PCT/GB2020/051219, mailed Aug. 21, 2020.
International Search Report for International Application No. PCT/GB2020/051219, mailed Oct. 13, 2020.
Written Opinion for International Application No. PCT/GB2020/051219, mailed Oct. 13, 2020.
Search Report for Great Britain Application No. 1907158.8, mailed Oct. 24, 2019.
Invitation to Pay Additional Fees and, Where Applicable, Protest Fee for International Application No. PCT/GB2020/051221, mailed Aug. 24, 2020.
International Search Report for International Application No. PCT/GB2020/051221, mailed Oct. 22, 2020.
Written Opinion for International Application No. PCT/GB2020/051221, mailed Oct. 22, 2020.
Invitation to Pay Additional Fees and, Where Applicable, Protest Fee for International Application No. PCT/GB2020/051222, mailed Aug. 27, 2020.
International Search Report for International Application No. PCT/GB2020/051222, mailed Oct. 19, 2020.
Written Opinion for International Application No. PCT/GB2020/051222, mailed Oct. 19, 2020.
Examination Report Under Section 18(3) for Great Britain Application No. 1907158.8, mailed Aug. 29, 2023.
Gupta, Shoubhik et al. "Ultra-Thin Chips for High-Performance Flexible Electronics" Nature Partner Journals; Mar. 14, 2018.
Johnson Electric "Parlex Options for Shielding Flexible Printed Circuits and Shielded Flexible Flat Cable" Available at htttps://www.johnsonelectric.com/en/resources-for-engineers/flat-flexible-cables/flat-flexible-cables-design-considerations/flat-flexible-cables-design-considerations-parlex-options-for-shielding-flexible-printed-circuits-and-shielded-flexible-flat-cable; Date Unknown.
Kamikoriyama, Yoichi et al. "Ambient Aqueous-Phase Synthesis of Copper Nanoparticles and Nanopastes with Low-Temperature Sintering and Ultra-High Bonding Abilities" Scientific Reports; Jan. 29, 2019.
Sekitani, Tsuyoshi et al. "Human-Friendly Organic Integrated Circuits" Materials Today; vol. 14, No. 9; Sep. 2011.
International Preliminary Report on Patentability for International Application No. PCT/GB2020/051219, mailed Dec. 2, 2021.
International Preliminary Report on Patentability for International Application No. PCT/GB2020/051221, mailed Dec. 2, 2021.
International Preliminary Report on Patentability for International Application No. PCT/GB2020/051222, mailed Dec. 2, 2021.
Examination Report Under Section 18(3) for Great Britain Application No. 1907158.8, mailed Nov. 21, 2023.
Examiner's Report of Telephone Conversation for Great Britain Application No. 1907158.8, mailed Dec. 14, 2023.
Intention to Grant Under Section 18(4) for Great Britain Application No. 1907158.8, mailed Jan. 10, 2024.
Office Action for U.S. Appl. No. 17/611,611, mailed Jan. 19, 2024.
Office Action (Restriction Requirement) for U.S. Appl. No. 17/611,614, mailed May 1, 2024.
Office Action (Restriction Requirement) for U.S. Appl. No. 17/611,614, mailed May 13, 2024.
Notice of Allowance for U.S. Appl. No. 17/611,611, mailed Oct. 28, 2024.
Office Action for U.S. Appl. No. 17/611,611, mailed Jul. 25, 2024.
Office Action for U.S. Appl. No. 17/611,614, mailed Aug. 27, 2024.
Notice of Allowance for U.S. Appl. No. 17/611,614, mailed Mar. 19, 2025.

\* cited by examiner

FLEXIBLE ELECTRONIC STRUCTURE

CROSS-REFERENCE TO RELATED APPLICATIONS

This application is a national stage application under 35 U.S.C. 371 of PCT Application No. PCT/GB2020/051219 having an international filing date of 19 May 2020, which designated the United States, which PCT application claimed the benefit of Great Britain Application No. 1907158.8, filed 21 May 2019, each of which are incorporated herein by reference in their entirety.

The present invention relates generally to the field of electrical circuits and microchips and relates in particular to an improved flexible electronic structure, such as, for example, Integrated Circuit (IC), that is adapted for bonding with an external circuit. More specifically, the present invention relates to a flexible IC configured for improved protection of its electronic components during bonding.

INTRODUCTION

In the past decade, flexible circuitry has been branching out significantly from its initial role as a simple wire replacement to providing very cost-effective, but more complex interconnects, as well as, low-cost flexible integrated circuits (ICs) that can easily be embedded into everyday objects.

A flexible circuit structure, such as, for example, a flexible integrated or printed circuit (i.e. IC), is a patterned arrangement of circuitry and components that utilises flexible base material with or without flexible over lay. In particular, the flexible circuit structure (e.g. flexible IC) may be formed in a thin layer of soft polymer film so that the flexible circuit structure can be bent or even stretched while maintaining integrity and functionality of the integrated circuit. Also, in contrast to a rigid silicon wafer IC, flexible circuit structures have usually no further protection, such as a hard, outer plastic case, and may therefore be vulnerable to damage.

As the demands of modern electronic systems call for increasing functionality, greater circuit density, higher connectivity, better environmental performance, and all at low-cost, flexible circuit structures are constantly improved and/or adapted to be embedded into or combined with external application circuits. For example, flexible circuit structures (e.g. flexible ICs) may be attached to an external application circuit, so as to support/enhance the application circuit, or to provide additional functionality. Typically, anisotropic conductive adhesive (ACA, also referred to as anisotropic conductive paste (ACP), anisotropic conductive film (ACF) and z-axis adhesive, is used to operably attach the flexible circuit structure to the application circuit.

ACA consists of an adhesive organic binder with a filling material of conductive particles forming a paste. In general, the adhesive (e.g. ACA) is placed between a flexible circuit structure and respective contacts of an application circuit. A bonding tool (e.g. thermodes) is then used to press (while applying heat) the conductive particles into respective contacts of the flexible circuit structure and the application circuit forming an electrically conductive interface between the flexible circuit structure and the application circuit. Since the conductive particles are isolated within the non-conductive adhesive matrix, no lateral conduction takes place. The binder cures thermally to secure the bond between the flexible circuit structure and the application circuit.

One advantage of using ACA is that it allows the assembly of flexible circuit structures and external circuits without the need for an accurate (and hence time-consuming and/or costly) placement of a conductive adhesive onto the small engaging contacts. In fact, the adhesive (i.e. ACA) may cover the whole area of the flexible circuit structure without the risk of causing a short circuit, because the electrically conductive particles are adapted to only provide a conductive interface between the desired connection of the flexible circuit structure and the application circuit. In addition, when using ACA, there is no need to apply an additional non-conductive adhesive to provide mechanical integrity to the flexible circuit structure/application circuit assembly.

However, when using ACA for bonding thermodes are required to apply a relatively high pressure so as to squeeze the adhesive layer (e.g. ACA) provided between the flexible circuit structure and the application circuit until the adhesive layer (e.g. ACA) is a little thinner than the diameter of the conductive particles. While this technique works sufficiently well for rigid silicon chips and other rigid or individual flexible circuits, many flexible circuit structures may only have a relatively soft and/or very thin (e.g. <1 µm) protective layer between the embedded circuitry (e.g. IC) and the adhesive layer (e.g. ACA).

Consequently, there is a real danger of the conductive particles (which may be several µm in diameter) to be pressed into the flexible circuit structure's circuit component(s), thus, potentially causing structural damage, short circuits, open circuits and/or other damage to the flexible circuit structure.

FIGS. 1(a) and (b) show a simplified illustration of the described bonding technique using thermodes 10a, 10b and an Anisotropic Conductive Adhesive (ACA) layer 12 to operably attach a flexible circuit structure (i.e. a flexible IC) 14 to an application circuit 16 (e.g. an external circuit).

During assembly, the ACA 12 is provided between respective interface surfaces (each comprising circuit contact elements 18, 20) of the flexible circuit structure 14 and the application circuit 16, wherein an upper thermode 10a and a lower thermode 10b are placed on respective outer surfaces of the flexible circuit structure 14 and the application circuit 16. Upper and lower thermode 10a, 10b provide a predetermined force by pressing the flexible circuit structure 14 and the application circuit 16 together while applying a predetermined heat energy. Applied heat and pressure cause the ACA 12 to flow so that conductive particles 22 are trapped between corresponding contact elements 18, 20, thus, forming a localised electrical connection between corresponding contact elements 18 and 20. As illustrated in FIG. 1 (b), under pressure (and heat) conductive particles 22 may penetrate the flexible substrate 24 potentially damaging the embedded IC 26 or any circuit component.

Consequently, it is an object of the present invention to provide a flexible electronic structure with improved robustness, as well as, an improved functionality. In particular, it is an object of the present invention to provide a flexible electronic structure that is adapted to minimise risk of damage to electronic component(s) during bonding.

SUMMARY OF THE INVENTION

According to a first aspect of the present invention, there is provided a flexible electronic structure for bonding with an external circuit, comprising:

a flexible substrate, having a first surface, configured for bonding with the external circuit, and an opposing second surface, configured for engagement with a bonding tool, comprising at least one electronic component;

at least one contact member, operatively coupled with said at least one electronic component and provided at said first surface of said flexible substrate, and adapted to operably interface with the external circuit after bonding;

at least one shield member, provided at said first surface so as to shieldingly overlap at least a portion of said at least one electronic component, adapted to withstand a predetermined pressure applied to said first surface and/or said opposing second surface during bonding with the external circuit.

Advantageously, said at least one shield member may have a predetermined thickness adapted to optimise planarity of said first surface. Preferably, wherein any one of said at least one shield member and said at least one contact member may be arranged coplanar with said first surface.

The added shield member provides the advantage of a more robust flexible structure, especially during bonding with an external application circuit using an anisotropic conductive adhesive or paste and thermodes applying a relatively high pressure. While the shield member at the very least provides a structural barrier to potentially damaging ACA particles, it can also improve the planarity of the contact surface engaging with the application circuit, in particular, when relatively thick or proud contact members are present. Thus, potentially reducing detrimental deformation of the flexible electronic structure during bonding.

Advantageously, said at least one shield member may be operably coupled to said at least one electronic component. Preferably, said at least one shield member may be configured to provide a ground potential to said at least one electronic component. Alternatively or additionally, said at least one shield member may be configured to provide a heat sink or heat spreader for at least a portion of said at least one electronic component. Alternatively or additionally, said at least one shield member may be configured to provide electromagnetic shielding to at least a portion of said at least one electronic component.

This provides the advantage of improved and/or additional functionality while keeping the structure's size at a minimum.

Advantageously, said at least one shield member may comprise a plurality of shield members operably arranged at said first surface. Preferably, said plurality of shield members may be electrically isolated from one another.

Advantageously, said at least one shield member may be electrically isolated from said at least one contact pad.

Advantageously, said at least one shield member may be operatively coupled to said at least one contact member.

Advantageously, said shield member may be an integral extension of said at least one contact member.

Advantageously, said at least one shield member comprises a patterned contact layout.

Advantageously, at least a portion of said at least one shield member may be provided with an insulation layer configured to prevent an electrically conductive connection between said at least one shield member and the external circuit.

This provides the advantage that the shield member may be utilised as a bridge across sensitive components, such as, for example, antenna windings.

Advantageously, said at least one shield member may be adapted to operably engage with at least a portion of the external circuit.

Advantageously, said at least one electronic component may be an integrated circuit (IC). Preferably, said flexible integrated circuit (IC) structure may be configured for adhesive bonding with an external circuit.

Alternatively, said flexible integrated circuit (IC) structure may be configured for solder bump bonding with an external circuit.

BRIEF DESCRIPTION OF THE DRAWINGS

Example embodiments of the description will now be described, by way of example only, with reference to the accompanying drawings, in which.

DETAILED DESCRIPTION OF THE PREFERRED EMBODIMENT(S)

The described example embodiment(s) relate(s) to flexible integrated circuits (ICs) and in particular, to flexible ICs suitable for assembly with an external application circuit. Further, in the described detailed example, thermode bonding with anisotropic conductive adhesives (ACAs) is utilised to operatively couple the flexible IC to the external application circuit. However, it is understood by the person skilled in the art that any other suitable bonding mechanisms may be used, such as, for example, solder bump bonding.

Also, the term Integrated Circuit (IC) used in this disclosure may be interpreted very broadly, and the nature of ICs and other products described may be extremely diverse. Any item comprising an electronic component and exhibiting some electronic activity is in scope. ICs may include but are not limited to digital ICs, analogue ICs, mixed-signal ICs, microprocessors, digital signal processors (DSPs), logic ICs, microcontrollers, interface ICs, programmable logic devices, application-specific ICs (ASICs), RFID ICs, RF ICs, memory ICs, sensors, power management circuits, operational amplifiers, data acquisition ICs, clock/timing ICs etc., but also any suitable passive electronic components.

Furthermore, throughout the specification, the term "connected" is understood to mean a direct connection such as electrical, mechanical or magnetic connection between the things that are connected. The term "coupled" is understood to mean a direct or indirect connection (i.e. through one or more passive or active intermediary devices or components). Further, unless otherwise specified, the use of ordinal adjectives, such as, "first", "second", "third" etc. merely indicate that different instances of like objects are being referred to and are not intended to imply that the objects so described must be in a given sequence, either temporally, spatially, in ranking or in any other manner. Orientation terminology, such as, "horizontal" is understood with respect to a plane parallel to the conventional plane or surface of a wafer or substrate, regardless of the orientation of the wafer or substrate. The term "vertical" may refer to a direction perpendicular to the horizontal as defined previously. Prepositions, such as, "on", "side", "higher", "upper", "lower", "over", "bottom" and "under" may be understood with respect to the conventional plane or surface being on the top surface of the wafer or substrate, regardless of the orientation of the electrical interconnects or the electronic package.

Figure 1:
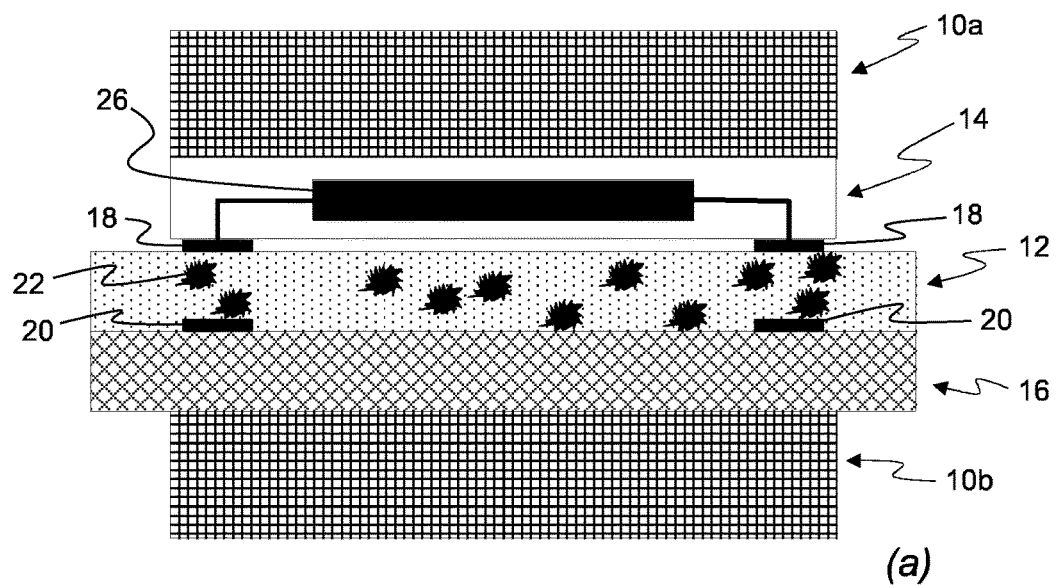
FIG. 1 (Prior Art) is a simplified schematic illustration of a flexible electronic structure that is bonded to an external application circuit utilising Anisotropic Conductive Adhesive (ACA) and suitable thermodes (bonding tool) (a) a section view of the assembly and bonding tool before applying pressure and heat, and (b) a section view of the assembly and bonding tool after applying suitable pressure and heat, highlighting damage caused by ACA particles.
Figure 1:
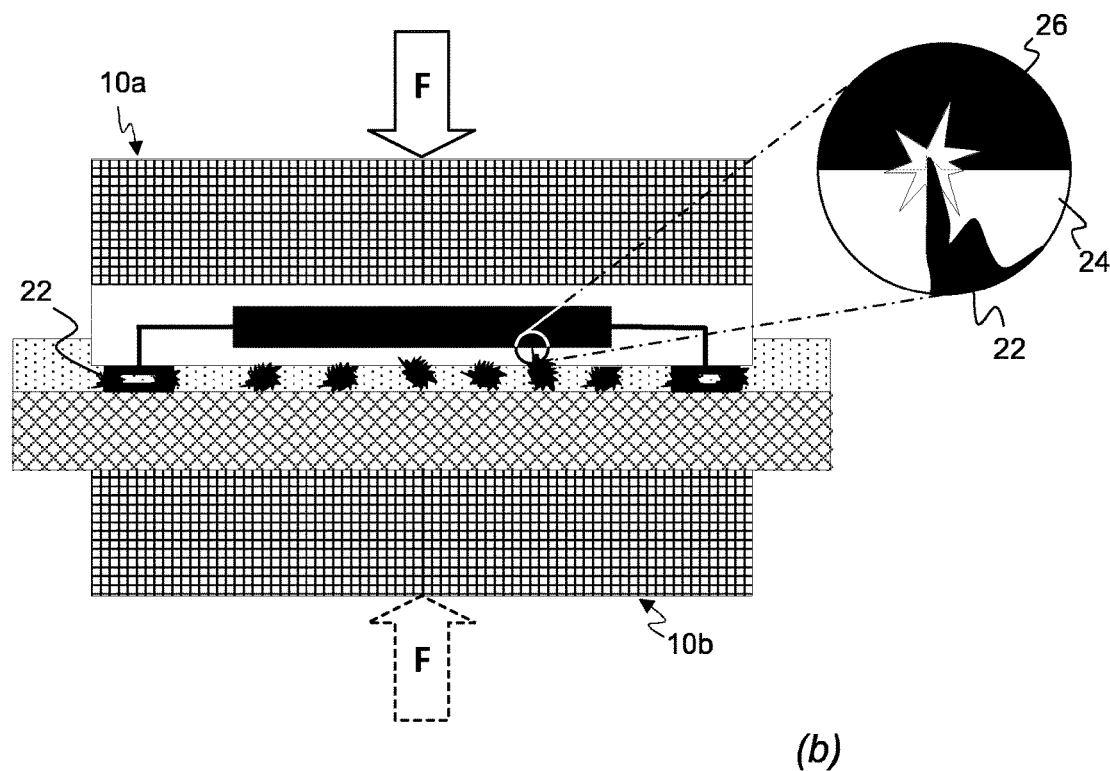
Figure 2:
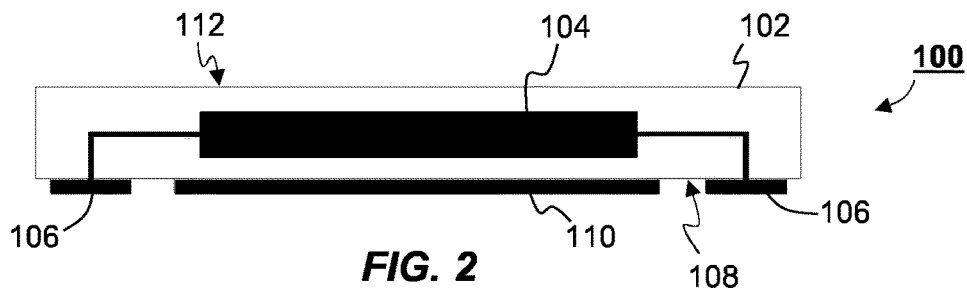
FIG. 2 is a simplified schematic illustration of an embodiment of the flexible electronic structure of the present invention, including a single shield, electrically isolated and configured to provide protection to the embedded IC.

Referring now to FIG. 2, a first embodiment of the flexible electronic structure 100 comprises a flexible substrate 102, an integrated circuit (IC) 104 embedded within the flexible substrate and operably coupled to two contact pads 106 provided on a bottom surface 108 of the flexible electronic structure 100. A shield or shield member 110 is provided on the bottom surface 108 between the two contact pads 106, so as to protectively cover at least the footprint of the embedded IC. In this particular example, the shield member 110 is electrically isolated from the contact pads 106, as well as from the integrated circuit 104 of the flexible electronic structure 100.

It is understood by the person skilled in the art that the IC 104 of the flexible electronic structure 100 may only be partially embedded in the flexible substrate 102 or simply attached to a top surface 112 of the flexible electronic structure 100 without deviating from the scope of the present invention.

The shield 110 may be formed in a metal layer provided on the bottom surface 108 of the flexible electronic structure 100. For example, the metal layer used for forming the contact pads 106 may be utilised to provide the shield member 110 provided between the two (or more) contact pads 106, as well as, the contact pad(s) 106. The thickness of the metal layer used for the shield member 110 is chosen so as to provide sufficient structural protection against anticipated damage. Further, the thickness of the metal layer may be configured to project from the insulating bottom surface 108 of the flexible electronic structure 100, so as to provide a 'stand-off' distance between the bottom surface 108 (e.g. the insulating layer of polymer or passivation) of the flexible electronic structure 100 and the application circuit (not shown).

The projecting shield member 110 (i.e. metal layer of predetermined thickness) may be configured to improve the planarity of the flexible electronic structure 100, in particular, a flexible electronic structure 100 having relatively thick (i.e. relative to the thickness of the flexible electronic structure), proud contact pads 106. Such a projecting shield member 110, suitably positioned between any of the proud contact pads 106, can minimise potential bowing or deformation of the flexible electronic structure 100 between the contact pads 106, further reducing the risk of damage during bonding with an external circuit or any other external surface.

In an alternative embodiment, the metal layer forming the contact pad(s) 106 and shield member 110 may be provided co-planar with the insulating surface (e.g. polymer, passivation layer) of the flexible electronic structure 100.

Figure 3:
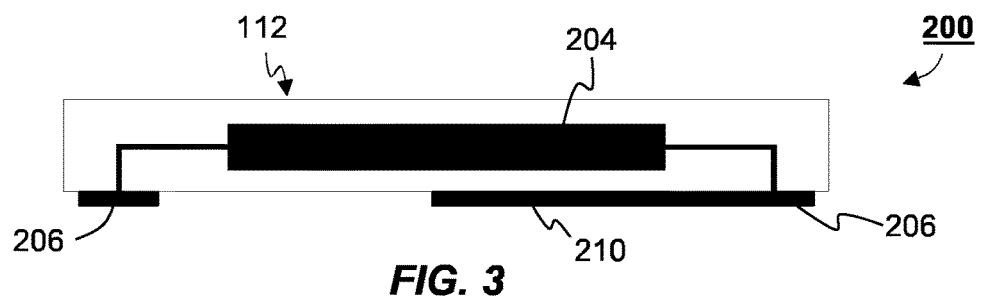
FIG. 3 is a simplified schematic illustration of another embodiment of the flexible electronic structure of the present invention, including a single shield that is provided as an integral portion of a contact pad of the flexible electronic structure and which is configured to provide protection to a portion of the embedded IC.

FIG. 3 shows a simplified schematic illustration of another embodiment of a flexible electronic structure 200 of the present invention. In this particular example, the shield member 210 is connected to, or an integral extension of, one or more contact pad(s) 206 protectively covering (i.e. partially shielding) only a predetermined portion of the integrated circuit 204. The portion of the integrated circuit (IC) 204 covered by the shield member 210 may be particularly vulnerable to damage. This example embodiment can be manufactured more efficiently as the contact pad(s) 206 and connected/integral shield member 210 can be formed in a single manufacturing step.

Figure 4:
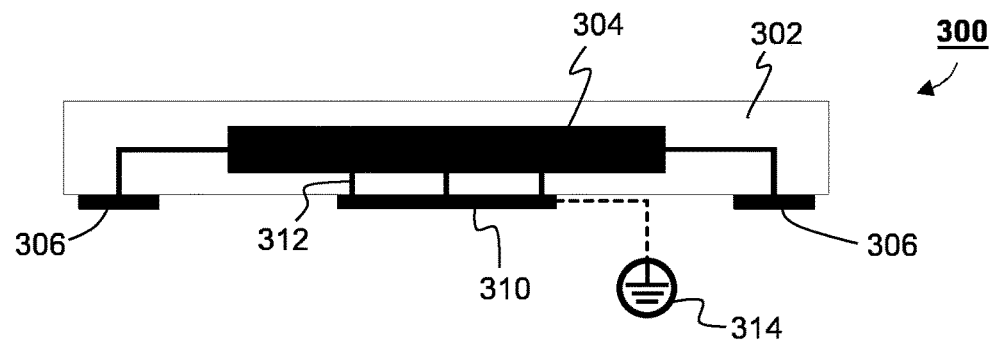
FIG. 4 is a simplified schematic illustration of another embodiment of the flexible electronic structure of the present invention, including a single shield either electrically (e.g. ground potential) or thermally (e.g. heat sink/spreader) coupled to the embedded IC of the flexible electronic structure.

Referring now to FIG. 4, another embodiment of the flexible electronic structure 300 comprises at least one shield member 310 that is operably coupled to the integrated circuit (IC) 304, so as to provide one or more supplementary function(s). For example, the shield member 310 may be thermally coupled to the integrated circuit (IC) 304 through heat-conducting structures, such as vias 312, to allow heat extraction from the vicinity of the integrated circuit (IC) 304. Here, the shield member 310 is configured to provide a heat sink or heat spreader.

In another example, shield member 310 may be electrically coupled to at least a part of the integrated circuit (IC) 304, e.g. to serve as a floating or virtual ground potential 314. It is understood by the person skilled in the art that the operably coupled shield member 310 may be utilised to provide both functions, i.e. a heat sink and ground potential 314.

Figure 5:
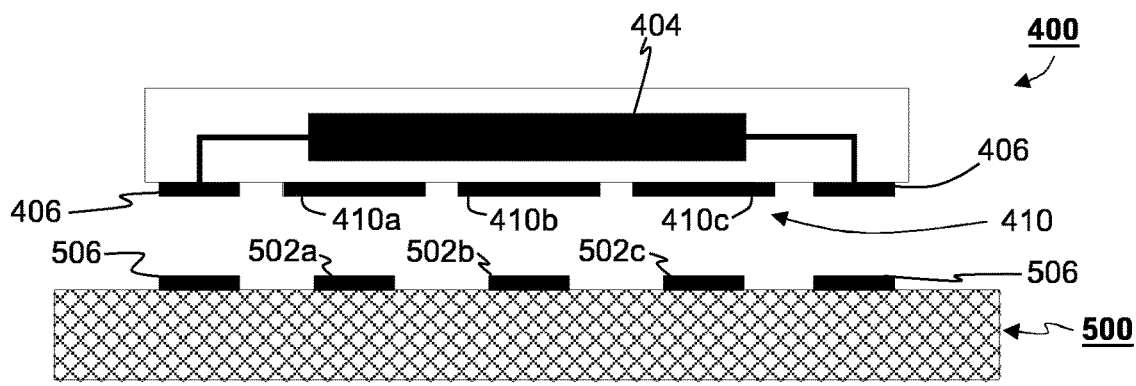
FIG. 5 is a simplified schematic illustration of another embodiment of the flexible electronic structure of the present invention, including a plurality of electrically isolated shield sections, configured to provide a "bridge" across electronic component(s) of the application circuit and/or optical access patterns (i.e. apertures) to predetermined sections of the IC embedded in the flexible structure.

FIG. 5 shows a simplified schematic illustration of yet another embodiment of the flexible electronic structure 400 of the present invention, where the flexible electronic structure 400 is positioned over an external application circuit 500 prior to bonding. In particular, the positioning and coverage of the shield member 410 may depend on the nature of any surface features of the external application circuit 500 provided between or otherwise in the vicinity of the application circuit contact pads 506.

For example, the flexible electronic structure 400 may serve as a "bridge" across conductors 502a, 502b, 502c on the external application circuit 500, such as windings of an antenna. In this case, the shield member 410 may be formed from electrically isolated sections 410a, 410b, 410c, each of which may make contact with a single antenna winding 502a, 502b, 502c, without causing any shorting between windings or any loss of circuit performance. The electrically isolated sections 410a, 410b, 410c of the shield member 410 may be positioned in such a way to provide gaps to allow, for example, optical access from the shield member side of the flexible electronic structure 410 to the specific sections of the integrated circuit 404 (e.g. laser-programmable memory cells).

In addition to the embodiments described, other supplementary functions may be provided to the integrated circuit 104, 204, 304, 404 by the electrically connected shield member 110, 210, 310, 410. For example, the shield member 110, 210, 310, 410 may be configured/designed to minimise parasitic interactions with the integrated circuit(s) 104, 204, 304, 404 by minimising overlap capacitance and/or increasing the thickness and/or reducing the relative permittivity of the upper insulating layer (i.e. dielectric, passivation layer) separating the metal tracking and contact pad layers. Optionally or additionally, the shield member 110, 210, 310, 410 may be configured to provide optical shielding of at least part or all of the underlying integrated circuit (IC) 104, 204, 304, 404 (e.g. memory cells) to prevent or inhibit discovery of the circuit details (e.g. memory cell content). Furthermore, the shield member 110, 210, 310, 410 may be configured to provide shielding to electro-magnetic interference (EMI) or radiation (e.g. β-rays). In particular, the shield member 110, 210, 310, 410 may comprise a predetermined patterning (e.g. patterned contact layout) adapted to minimise EMI, and/or, the shield member 110, 210, 310, 410 may be made of, or covered with, a material suitable to minimise EMI and/or radiation (e.g. β-rays).

Preferably, any one of the described shield members 110, 210, 310, 410 may be formed from a metallic material. However, any one of the described shield members 110, 210, 310, 410 may also be formed from a non-metallic material (e.g. polymer, metal-oxide). The shield member 110, 210, 310, 410 may be produced by any suitable technique, such as, for example, patterned deposition (printing), lithographic patterning of unpatterned deposited layers, electroplating, etc. For some flexible electronic structures 100, 200, 300, 400, digital lithography may be used to pattern the metal layer forming the shield member 110, 210, 310, 410 and/or contact pads 106, 206, 306, 406, therefore, allowing similar flexible electronic structures 100, 200, 300, 400 to feature different shield patterns.

Additionally, a further insulating layer may be provided so as to cover some or all of the shield member 110, 210, 310, 410, for example, to prevent the shield member 110, 210, 310, 410 from short-circuiting conductive features on the external application circuit 500.

Also, it is understood by the person skilled in the art, that the shield member 110, 210, 310, 410 is hard enough to provide sufficient resistance to deformation induced by external forces (e.g. from the conductive particles of the ACA and thermode pressure/heat), so as to prevent damage to the underlying integrated circuit (IC) 104, 204, 304, 404 features. The flexibility of the shield member 110, 210, 310, 410 may be determined by choosing a suitable thickness. In some example embodiments of the flexible electronic structure 100, 200, 300, 400, the protective layer between the integrated circuit (IC) 104, 204, 304, 404 and the adhesive layer (e.g. ACA) (e.g. an upper insulating layer, i.e. dielectric, passivation layer, separating metal tracking and pad layers) may be formed from a relatively hard polymer material, so that the shield member 110, 210, 310, 410 thickness can be reduced. Alternatively, the (relatively hard) upper insulating layer (i.e. dielectric, passivation layer) may itself serve as the shield member.

Although the embodiments of the present invention are described herein in the context of flexible ICs that are adhesively bonded to an application circuit, the characterising feature(s) of the present invention may be equally applicable to a range of products. For example, the shield member may be utilised with electronic components, such as capacitors, resistors, conductors, inductors, transistors, diodes etc., in 'discrete' or other forms that would not be considered integrated circuits. One specific example is a thin film capacitor, formed by precision lithographic techniques using appropriate process tools. Such precision capacitors, which may be formed at low temperature on flexible substrates, have many potential applications, for example in wearable electronics, health monitoring and medical devices.

It will be appreciated by persons skilled in the art that the above embodiment(s) have been described by way of example only and not in any limitative sense, and that various alterations and modifications are possible without departing from the scope of the invention as defined by the appended claims.

The invention claimed is:

1. A flexible electronic structure for bonding with an external circuit, comprising:
   a flexible substrate, having a first surface, configured for bonding with the external circuit, and an opposing second surface, configured for engagement with a bonding tool, wherein the flexible substrate comprises at least one embedded component;
   at least one contact member, operatively coupled with said at least one embedded electronic component and provided at said first surface of said flexible substrate, and adapted to operably interface with the external circuit after bonding, and
   at least one mechanical shield member, the at least one mechanical shield member provided at said first surface, the at least one mechanical shield member located between the external circuit and the at least one embedded component during bonding, the at least one mechanical shield member having an overlapping footprint with at least a portion of the at least one embedded component.

2. The flexible integrated circuit (IC) structure according to claim 1, wherein said at least one mechanical shield member has a predetermined thickness adapted to optimize planarity of said first surface, wherein the at least one mechanical shield member is adapted to withstand a predetermined pressure applied to said first surface and/or said opposing second surface during bonding with the external circuit.

3. The flexible integrated circuit (IC) structure according to claim 1, wherein any one of said at least one mechanical shield member and said at least one contact member is arranged coplanar with said first surface.

4. The flexible integrated circuit (IC) structure according to claim 1, wherein said at least one mechanical shield member is operably coupled to said at least one embedded electronic component.

5. The flexible integrated circuit (IC) structure according to claim 4, wherein said at least one mechanical shield member is configured to provide a ground potential to said at least one embedded electronic component.

6. The flexible integrated circuit (IC) structure according to claim 1, wherein said at least one mechanical shield member is configured to provide a heat sink or heat spreader for at least a portion of said at least one embedded electronic component.

7. The flexible integrated circuit (IC) structure according to claim 1, wherein said at least one mechanical shield member is configured to provide electromagnetic shielding to at least a portion of said at least one embedded electronic component.

8. The flexible integrated circuit (IC) structure according to claim 1, wherein said at least one mechanical shield member comprises a plurality of shield members operably arranged at said first surface.

9. The flexible integrated circuit (IC) structure according to claim 8, wherein said plurality of mechanical shield members are electrically isolated from one another.

10. The flexible integrated circuit (IC) structure according to claim 1, wherein said at least one mechanical shield member is electrically isolated from said at least one contact pad.

11. The flexible integrated circuit (IC) structure according to claim 1, wherein said at least one mechanical shield member is operatively coupled to said at least one contact member.

12. The flexible integrated circuit (IC) structure according to claim 11, wherein said mechanical shield member is an integral extension of said at least one contact member.

13. The flexible integrated circuit (IC) structure according to claim 1, wherein said at least one mechanical shield member comprises a patterned contact layout.

14. The flexible integrated circuit (IC) structure according to claim 1, wherein at least a portion of said at least one mechanical shield member is provided with an insulation layer configured to prevent an electrically conductive connection between said at least one mechanical shield member and the external circuit.

15. The flexible integrated circuit (IC) structure according to claim 1, wherein said at least one mechanical shield member is adapted to operably engage with at least a portion of the external circuit.

16. The flexible integrated circuit (IC) structure according to claim 1, wherein said at least one embedded electronic component is an integrated circuit (IC).

17. The flexible integrated circuit (IC) structure according to claim 1, wherein said flexible integrated circuit (IC) structure is configured for adhesive bonding with an external circuit.

18. The flexible integrated circuit (IC) structure according to claim 1, wherein said flexible integrated circuit (IC) structure is configured for solder bump bonding with an external circuit.

19. A flexible electronic structure configured to bond with an external circuit, the flexible electronic structure comprising:
   a flexible substrate, having:
      a first surface, configured to bond with the external circuit, and
      an opposing second surface, configured to engage with a bonding tool, and wherein the flexible substrate comprises at least one embedded component;
   at least one contact member, operatively coupled with said at least one embedded electronic component, and associated with the first surface of said flexible substrate, and adapted to operably interface with the external circuit after a bonding has occurred, and
   at least one mechanical shield member, the at least one mechanical shield member provided at said first surface, the at least one mechanical shield member located between the external circuit and the at least one embedded component during bonding, the at least one mechanical shield member having an overlapping footprint with at least a portion of the at least one embedded component.

* * * * *